(12) United States Patent
Pedersen

(10) Patent No.: US 6,218,859 B1
(45) Date of Patent: Apr. 17, 2001

(54) PROGRAMMABLE LOGIC DEVICE HAVING QUADRANT LAYOUT

(75) Inventor: Bruce B. Pedersen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 09/320,007

(22) Filed: May 26, 1999

Related U.S. Application Data
(60) Provisional application No. 60/086,770, filed on May 26, 1998.

(51) Int. Cl.[7] ............................ H03K 19/177; H03K 7/38
(52) U.S. Cl. .................................. 326/39; 326/41
(58) Field of Search ................... 326/38, 39, 40, 326/41

(56) References Cited

U.S. PATENT DOCUMENTS

| | | | |
|---|---|---|---|
| 4,871,930 | 10/1989 | Wong et al. | 307/465 |
| 5,121,006 | 6/1992 | Pedersen | 307/465 |
| 5,241,224 | 8/1993 | Pedersen et al. | 307/465 |
| 5,550,782 | 8/1996 | Cliff et al. | 365/230.03 |
| 5,557,217 | 9/1996 | Pedersen | 326/39 |
| 5,760,604 | * 6/1998 | Pierce et al. | 326/41 |
| 5,880,598 | * 3/1999 | Duong | 326/41 |
| 5,903,165 | * 5/1999 | Jones et al. | 326/39 |
| 5,977,793 | * 11/1999 | Reddy et al. | 326/41 |

OTHER PUBLICATIONS

Altera Corporation, *1996 Data Book*, A–DB–0696–01, pp. 193–261 (Jun. 1996).

* cited by examiner

*Primary Examiner*—Son Mai
(74) *Attorney, Agent, or Firm*—Morrison & Foerster LLP

(57) ABSTRACT

Disclosed is a programmable logic device (PLD) that includes logic cells that can be allocated among zones and are preferably allocated among four quadrants. I/O pins are permanently associated with a quadrant by placing the I/O pins along an exterior edge of that quadrant. Logic cells which are located in a quadrant are directly connected to I/O pins which are permanently associated with that quadrant. Even if additional logic cells are added to the PLD without changing the number of I/O pins, the I/O pins located along an exterior edge of a quadrant will still be directly connected to the logic cells in that quadrant. Thus, a user can determine whether use of a given I/O pin and logic cell, regardless of the number of logic cells in the PLD, will result in an inter-quadrant signal transmission delay.

16 Claims, 4 Drawing Sheets

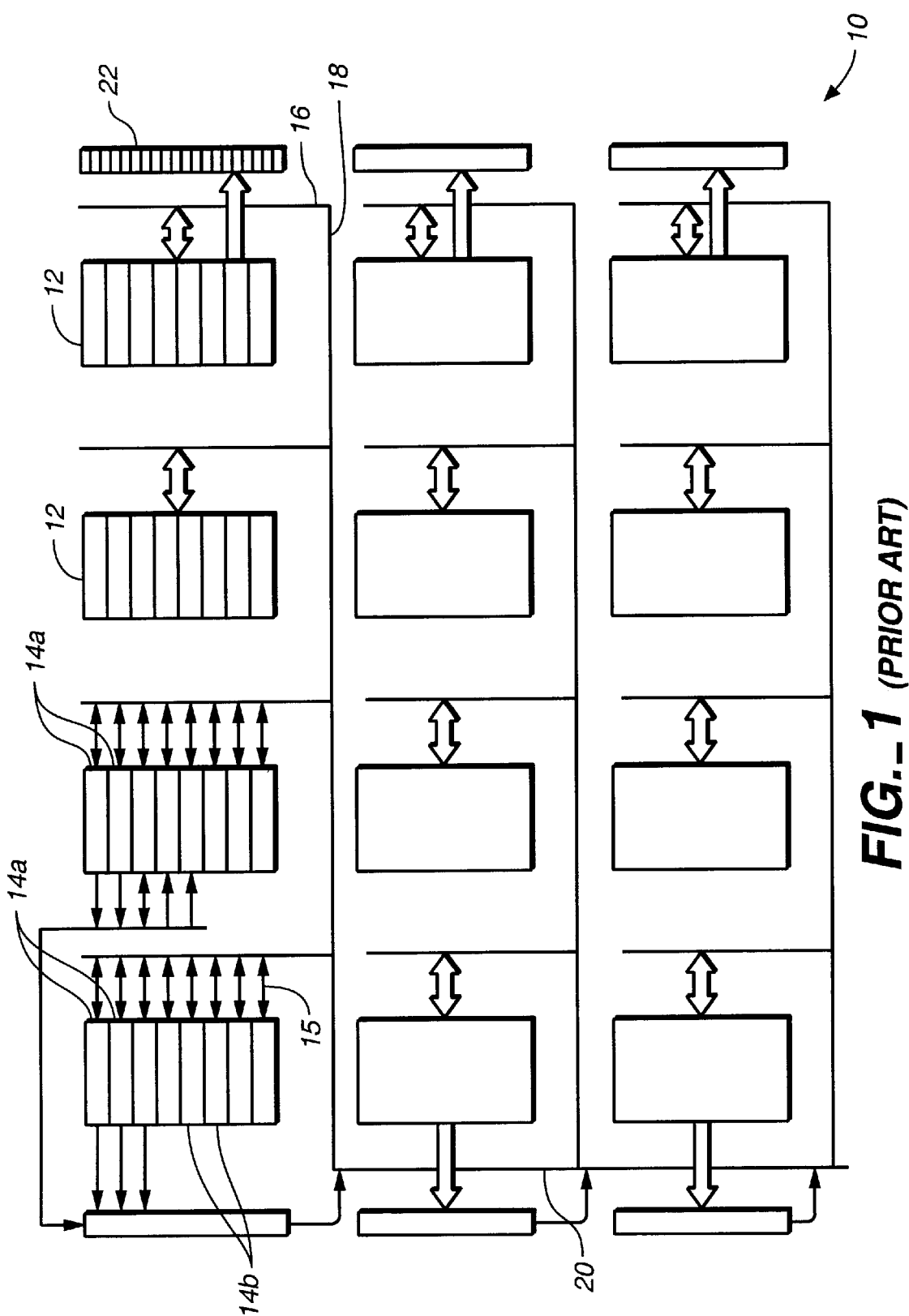
FIG._1 (PRIOR ART)

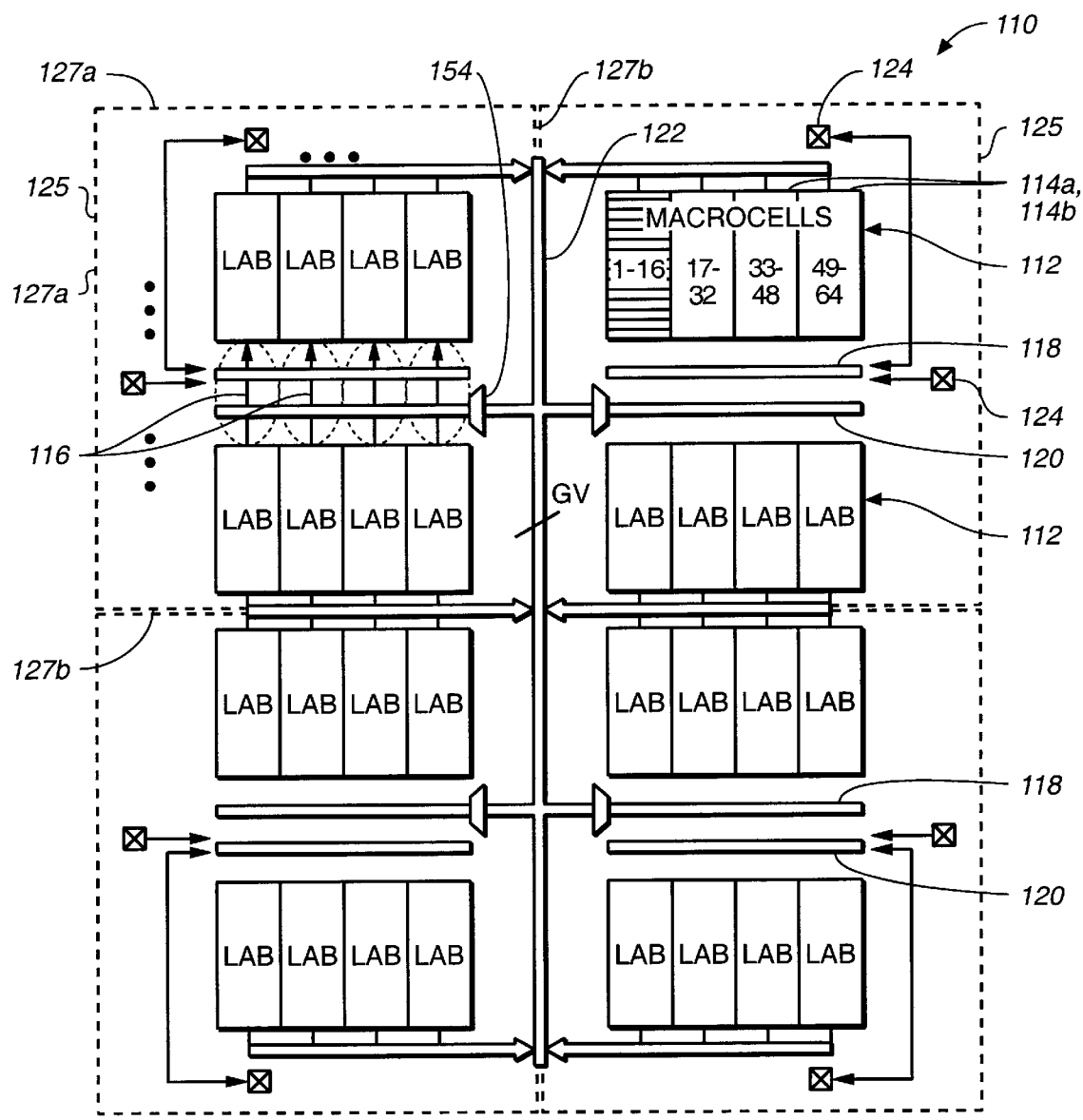
FIG._2

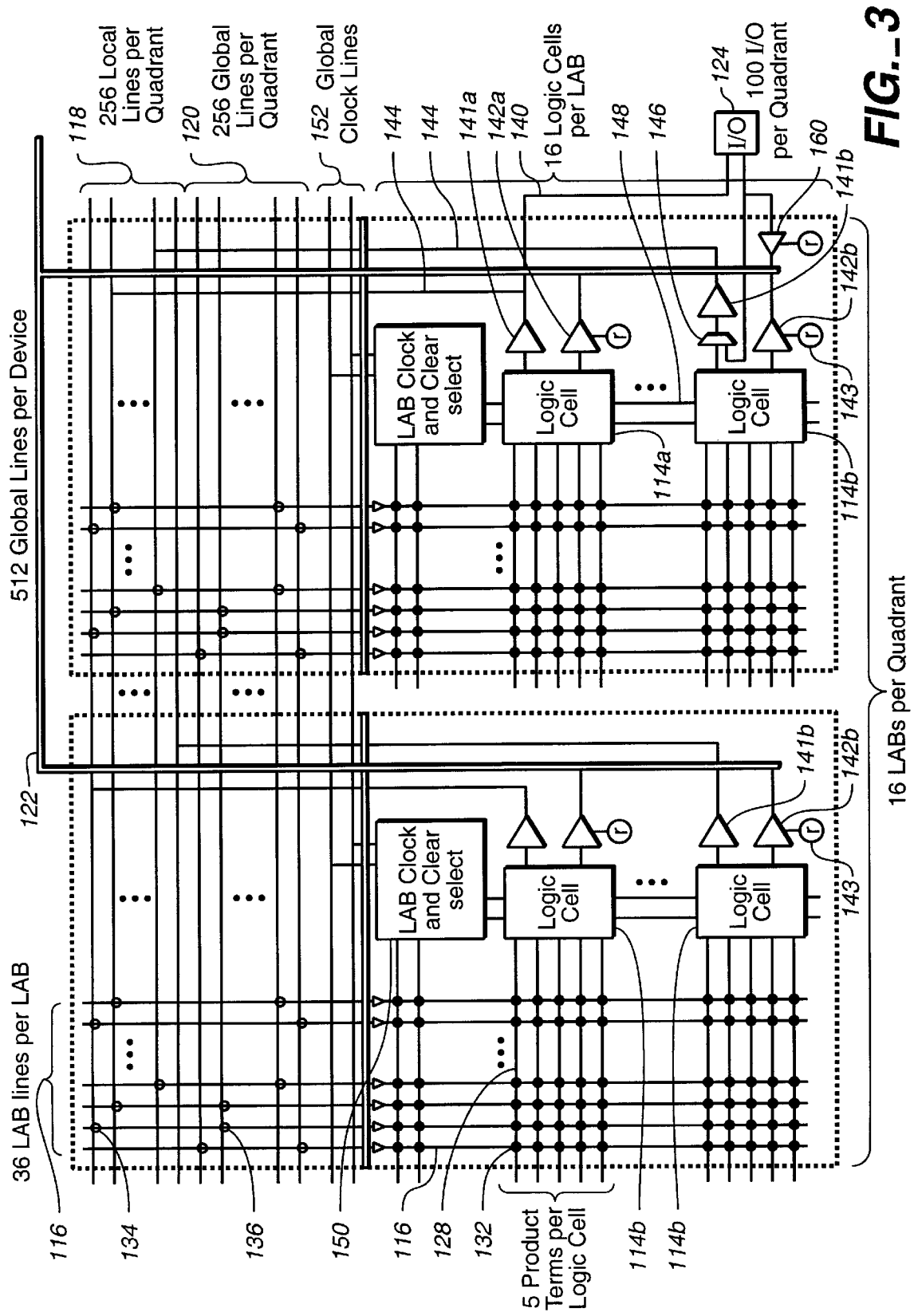

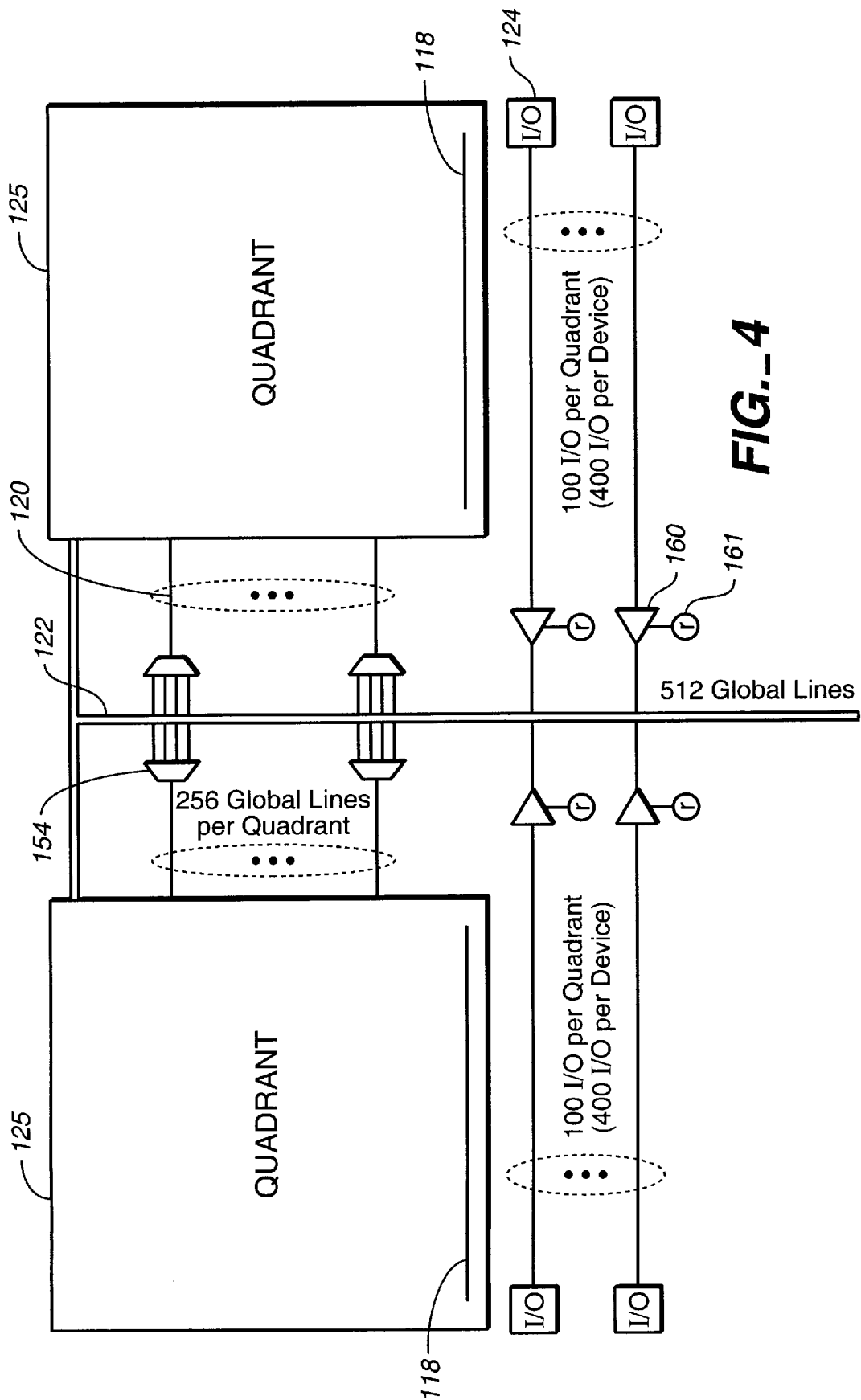
FIG._4

# PROGRAMMABLE LOGIC DEVICE HAVING QUADRANT LAYOUT

CROSS-REFERENCE TO RELATED APPLICATIONS

This application claims the benefit of U.S. Provisional Application No. 60/086,770, filed on May 26, 1998.

BACKGROUND

1. Technical Field

The present invention relates to architecture and layout for a programmable logic device. In particular, the present invention is directed to a programmable logic device having logic cells and associated I/O pins configured in quadrants.

2. Related Art

Programmable logic devices ("PLD"s) are known in which substantial numbers of relatively elementary individual programmable logic elements, or logic cells, are provided in a two-dimensional array. Typically, the logic cells are arranged in groups. These groups may be referred to as logic array blocks ("LAB"s). The array also includes a grid of intersecting signal conductors for conducting logic signals to, from, and between the programmable logic elements and I/O pins of the PLD.

FIG. 1 shows a simplified schematic view of the architecture for a typical such PLD 10. Details of the architecture shown in FIG. 1 are disclosed, for example, in commonly assigned U.S. Pat. No. 5,550,782, issued Aug. 27, 1996 to Cliff et al. As shown, a PLD 10 includes a plurality of logic cells 14a and 14b; LABs 12; and I/O pins 22 (shown schematically in blocks) along the side edges of PLD 10. Other pins (not shown) are typically included along both the top and bottom edges of PLD 10. Not all pins on PLD 10 are I/O pins used for data input and output. For example, some pins may used for power, grounding, and I/O control.

PLD 10 also includes a plurality of bit lines or product terms 15, a plurality of LAB lines 16, a plurality of global horizontal ("GH") lines 18, and a plurality of global vertical ("GV") lines 20. Product terms 15 interconnect the logic cells 14a, 14b to LAB lines 16. LAB lines 16 interconnect all the logic cells 14a and 14b in a single LAB 12. GH lines 18 interconnect all the LAB lines 16 in a single row of LABs 12, and GV lines 20 interconnect all the GH lines 18 in PLD 10. To reduce the number of interconnection lines necessary on a PLD, programmable elements are typically used to interconnect product terms 15 with LAB lines 16, GH lines 18 with LAB lines 16, and GV lines 20 with GH lines 18. Such programmable elements can include, for example, RAMs, EPROMs, EEPROMS, fuses, antifuses or other device which can programmatically either connect or disconnect one line with a second intersecting line. The details and use of such programmable elements is disclosed, for example, in U.S. Pat. No. 5,550,782 to Cliff et al., which is hereby incorporated by reference in its entirety.

In PLD 10, LABs 12 are arranged in 3 rows of 4 LABs 12 each. Each LAB 12 includes 8 logic cells 14a and 14b for performing either combinatorial or sequential logic functions. Each logic cell 14a, 14b includes at least one input and one output. I/O pins 22 are shown in 6 groups of 20 pins each. Outputs of logic cells 14a are directly interconnected with an I/O pin 22 and outputs of logic cells 14b can be interconnected with an I/O pin 22 only via a logic cell 14a. Logic cells 14a directly connected to I/O pins 22 will be referred to as direct output logic cells and logic cells 14b not directly connected to an I/O pin 22 will be referred to as buried logic cells. As shown in FIG. 1, the output of direct output logic cells 14a are connected both to LAB lines 16 and directly to I/O pins 22. Each LAB 12 contains 3 direct output logic cells 14a and 5 buried logic cells 14b. I/O pins 22 can drive onto GH lines 18 and GV lines 20. From these lines, signals can be transmitted via lab lines 16 to logic cells 14a and 14b.

Through the above described interconnections of product terms 15, LAB lines 16, GH lines 18, and GV line 20, input and output signals to PLD 10 can be transmitted to or from any logic cell 14a, 14b to any other logic cell 14a, 14b or any I/O pin 22 which is used for data input and output.

However, due to the architecture of PLD 10 described above, some such signal transmissions can take longer than others. Specifically, if a signal must be transmitted through a GV line 20 prior to reaching its destination at an I/O pin 22 or logic cell 14a, 14b, the transmission time for the signal will be greater than if a signal did not have to travel over a GV line 20. This is due to the increased total length of the transmission path over the GV line 20 and the additional programmable elements which the signal must pass through to be transmitted over a GV line 20.

One instance in which it is necessary to transmit a signal over a GV line 20 occurs when the signal is being transmitted from one row of LABs 12 to another such row. This situation can arise when a first logic cell 14a, 14b which is the source of a signal, is driving a second logic cell 14a, 14b. If the second logic cell 14a, 14b is in a different row of LABs from the first logic cell 14a, 14b, then there will be a delay in transmission time compared with a situation in which the first logic cell 14a, 14b is in the same row as the second logic cell 14a, 14b.

This additional transmission time may be undesirable in itself where high speed signal processing is required in a circuit using PLD 10. Additionally, under some circumstances, it may not be known by a user of PLD 10 whether this additional delay will occur. This can lead to difficulty in design of appropriate circuit parameters. One such circumstance arises in connection with so called "vertical migration" of I/O pins on a PLD when additional logic cells are added to the PLD without changing the number of I/O pins.

In manufacture of PLDs of the type discussed above, it is often desirable to fabricate PLDs having different total numbers of logic cells to accommodate differing uses and price points. Additionally, in fabricating PLDs having differing numbers of logic cells, it can be relatively less expensive to use the same die or pin out pattern with the same number of I/O pins than to change the number of I/O pins. To use the same die in fabricating a PLD, and increase the total number of logic cells in the PLD, typically either additional LABs are included in each row of the device, or, to avoid rows of LABs from becoming too long, additional rows of LABs 12 are fabricated in a PLD.

Generally, the outputs of direct output logic cells 14a ("direct outputs") in each row of four LABS 12 are assigned to the block of I/O pins 22 adjacent to (and above or below) that row. Additionally, the I/O pins 22 that can directly drive a row of LABs 12 ("direct inputs") are generally assigned to the row of LABs 12 to which the I/O pins 22 are adjacent. Thus, the direct inputs in the first and third row of LABs 12 will be assigned to I/O pins (not shown) located along the top and bottom edge, respectively, of PLD 10 and to the groups of I/O pins 22 on either end of the first and third rows of LABs 12, respectively. And, the direct outputs of the groups of I/O pins 22 at either end of the first and third rows of LABs 12 and at the top and bottom edges of PLD 10, respectively, will be assigned to the first and third rows of LABs 12, respectively. Similarly, the direct inputs of the second row of LABs 12 are directly connected to the two groups of I/O pins 22 on either end of the second row of LABs 12, and the direct outputs of these two groups of I/O pins are assigned to logic cells 14*a*, 14*b* in the second row of LABs 12.

If no additional I/O pins 22 are added to the PLD package when additional rows of LABs 12 are added to the PLD 10, it can become necessary to "vertically migrate" the I/O pins 22 associated with the different rows of LABs 12. That is, it can be necessary to change the direct input and direct output assignments between the groups of I/O pins 22 and rows of LABs 12 to accommodate the additional row of LABs 12. For example, if a forth row of LABs were added to PLD 10, then a portion of the direct input and direct output assignments nominally allocated to the third row of LABs 12 would be re-allocated to the new, fourth row of LABs 12. The third and fourth rows of LABs 12 could either split the direct input and output assignments nominally made to the third row of LABs 12, or, each row of LABs 12 in PLD 10 could give up some direct inputs and direct outputs nominally assigned to that row.

In either case, direct inputs and direct outputs nominally assigned to a row of LABs 12 may no longer be assigned to that row. As such, either a source direct output logic cell 14*a* or a source buried logic cell 14*b* could initially provide an output signal to a destination direct output logic cell 14*a* which is in the same row as the source logic cell 14*a* or 14*b*. Vertical migration could then cause a reassignment of the I/O pin 22 originally assigned to the destination direct output logic cell 14*a*, to another direct output logic cell 14*a* in a different row from the source logic cell 14*a*, 14*b*. If this occurs, then to take the output of the same I/O pin from the "new" destination direct output logic cell 14*a*, the signal will have to be transmitted over a GV line 20 and additional delay will be incurred. An analogous situation can arise with respect to input signals.

Accordingly, the vertical migration which can take place with the addition of logic cells 14*a* to a PLD can undesirably cause timing delays. And, after a vertical migration, a user of a PLD may not be certain which I/O pins 22 have direct inputs and direct outputs from a given row of LABs 12. As such the user cannot be certain whether these timing delays will occur or not with any given programmed logic function. This can undesirably cause un-anticipated difficulty in circuit implementation using a PLD.

SUMMARY OF THE INVENTION

The present invention includes a programmable logic device (PLD) which is laid out to allow changes in the number of logic cells carried by the PLD without uncertainty regarding signal timing delays. The number of logic cells can be increased without increasing the number of I/O pins and no uncertainty in signal timing due to signal transfer over a global interconnection line will result. In one aspect of the present invention, a PLD can be divided into a plurality of zones. Logic cells are allocated among the plurality of zones. The PLD also includes I/O pins and interconnection lines. Each of the I/O pins can be permanently associated with one of the plurality of zones. The interconnection lines connect the logic cells with the I/O pins such that each of a portion of the logic cells can be directly connected with at least one of the I/O pins that is permanently associated with a zone in which the directly connected logic cell is located. In a preferred embodiment, the PLD is divided into four zones or quadrants. However, the PLD can also be divided into sixths or eighths or otherwise to produce any desired number of zones.

Another aspect of the present invention includes a method of fabricating a PLD having logic cells, I/O pins, and interconnection lines. The PLD is divided into four quadrants and a portion of the logic cells are allocated to each quadrant. A portion of the I/O pins are permanently associated with each quadrant. Each of the portion of I/O pins permanently associated with a quadrant can be directly connected to at least one of the plurality of logic cells located in that quadrant. The method of fabricating can also include dividing the PLD into any number of zones, rather than four quadrants.

Preferably, however, the PLD is divided into four, substantially square quadrants, each of which has two exterior edges along which I/O pins are located. The pins which are associated with a quadrant are located along an exterior edge of that quadrant.

In this way, additional logic cells can be added to the PLD without adding additional pins and a user can be certain that the I/O pins located along the exterior edge of a quadrant will be directly connected to logic cells in that quadrant. Thus, the user can advantageously be aware whether an inter-quadrant signal transfer timing delay will occur or not in transferring a signal between and I/O pin and a logic cell.

In yet another aspect of the invention a method of routing a signal in a PLD includes dividing the PLD into a plurality of zones. I/O pins are provided adjacent to each of the plurality of zones and a plurality of LABs are allocated to each of the zones. A plurality of local zone lines is also provided. Each of the local zone lines is for providing communication between only LABs located in each of the zones. An input signal is fed through one of the I/O pins and onto one of the local zone lines. This allows the input signal to be communicated to at least one of the LABs in the zone to which the I/O pin is adjacent. In a preferred embodiment, the PLD is divided into four quadrants.

BRIEF DESCRIPTION OF THE DRAWINGS

FIG. 1 is a simplified schematic diagram showing the architecture of an earlier PLD.

FIG. 2 is a simplified schematic diagram showing the architecture of a PLD having quadrants containing LABs in accordance with the present invention.

FIG. 3 is a detailed schematic diagram of a portion of one of the quadrants of the PLD shown in FIG. 2.

FIG. 4 is a schematic diagram of a portion of the PLD shown in FIG. 2 illustrating two of the four quadrants.

DETAILED DESCRIPTION

FIG. 2 shows a simplified schematic of the architecture of a PLD 110 in accordance with a presently preferred embodiment of the invention. As shown, PLD 110 includes direct output logic cells 114*a* and buried logic cells 114*b* (shown in greater detail in FIG. 3) grouped together in logic array blocks ("LAB"s) 112. LABs 112 are interconnected via LAB or word lines 116, local zone or quadrant lines 118, global zone or quadrant lines 120, and device global vertical ("GV") lines 122. As shown in FIG. 3, which is a detailed schematic of a portion of PLD 110, PLD 110 also includes bit lines or, preferably, product terms 128. The layout and function of interconnection lines 116, 118, 120, 122 and product terms 128 will be discussed in detail below. PLD 110 also includes I/O pins 124.

PLD 110 is divided into a plurality of sections or zones, and preferably, into four quadrants 125. In the embodiment shown in FIG. 2, each quadrant is substantially square and includes two exterior edges 127a and two interior edges 127b. Each quadrant 125 includes 16 LABs 112, and each LAB 112 includes 16 logic cells 114a, 114b. Accordingly, in the embodiment shown, each quadrant 125 includes 256 logic cells 114a, 114b. It is also considered, however, to include other numbers of logic cells 114a, 114b in each LAB 112 and/or other numbers of LABs 112 in each quadrant 125. Additionally, it is not necessary that PLD 110 be divided into four quadrants 125. It is also considered to divide PLD 110 into other numbers of zones.

As noted above, the network of product terms 128, LAB lines 116, local quadrant lines 118, global quadrant lines 120, and GV lines 122 serve to interconnect logic cells 114a, 114b and I/O pins 124 on PLD 110. Product terms 128 serve as input lines to logic cells 114a, 114b. Each logic cell 114a, 114b is preferably fed by 5 product terms 128. Product terms 128 are interconnectable to LAB lines 116. Each LAB 112 preferably includes 36 lab lines 116. Each product term 128 is preferably connectable to each LAB line 116 in the LAB 112 in which the product term 128 is located via a programmable element 132. Programmable elements 132 selectively provide either an open circuit, to disconnect two intersecting lines, or a substantially short circuit, to connect two intersecting lines, at the intersection of a LAB line 116 and a product term 128. Each programmable element 132 can be a RAM, EPROM, EEPROM, fuse, antifuse, or other device which can programmatically either connect or disconnect one line with a second intersecting line. The details of the use of such programmable elements is disclosed, for example, in U.S. Pat. No. 5,550,782 to Cliff et al. which has been incorporated by reference in its entirety.

Local quadrant lines 118 interconnect the LAB lines 116 of each LAB 112 only in each single quadrant 125. If PLD 110 is divided into more than four quadrants, then local zone lines interconnect LABs in only each single zone. Preferably, there are 256 local quadrant lines 118 per quadrant 125. Each local quadrant line 118 is preferably connected to 2 LAB lines 116 via a programmable elements 134, which are preferably the same type of programmable element as programmable elements 132 discussed above. Local quadrant lines 118 allow LABs 112 within the same quadrant 125 to exchange signals without placing signals on GV lines 122. Thus, local quadrant lines 118 advantageously allow relatively rapid communication of signals within a given quadrant 125.

Each quadrant 125 also includes 256 global quadrant lines 120 and PLD 110 includes 512 GV lines 122. Global quadrant lines 120 connect GV lines 122 to LAB lines 116. In this way, GV lines 122 are connected, through LAB lines 116 and product terms 128, to inputs of logic cells 114a, 114b. Global quadrant lines 120 are connected to LAB lines 116 by programmable elements 136 which can be the same type of programmable elements as programmable elements 132 and 134. Each global quadrant line 120 is preferably connected to two LAB 116 lines in a quadrant 125.

As shown in FIG. 4, which is a partial schematic view of PLD 110 showing two quadrants 125, GV lines 122 can feed global quadrant lines 120 through a plurality of global vertical ("GV") multiplexers 154. Preferably, 4 GV lines 122 are connected through a GV multiplexer 154 to a single global quadrant line 120. GV multiplexer 154 allows any of the 4 GV lines 122 connected to the inputs of GV multiplexer 154 to be interconnected to the single global quadrant line 120 connected the output of GV multiplexer 154. FIG. 4 also shows local quadrant lines 118.

As shown in FIG. 3, product terms 128 feed the inputs of logic cells 114a, 114b. A preferred embodiment of logic cells 114a, 114b is described fully in commonly assigned U.S. Pat. No. 5,121,006 to Pedersen which is hereby incorporated by reference in its entirety. In a preferred embodiment, each logic cell 114a, 114b comprises five product terms 128 and a programmable register providing D, T, SR, or JK flip-flop capability. Each product term 128 connects a product term 128 of a logic cell 114a, 114b to LAB lines 116. By combining the product terms 128 and flip-flop capabilities of a logic cell 114a, 114b, either with or without other logic cells 114a, 114b, both combinatorial and sequential logic functions can be performed.

A preferred logic cell 114a, 114b architecture also permits allocation, in which additional product terms 128 may be allocated from neighboring logic cells 114a, 114b, thereby increasing the maximum number of product terms 128 available to a logic cell 114a, 114b beyond the number physically included in each logic cell 114a, 114b. For example, in a preferred embodiment comprising five product terms 128 per logic cell 114a, 114b, additional product terms may be allocated to a first logic cell 114a, 114b from a neighboring logic cell 114a, 114b.

As noted above, PLD 110 includes two types of logic cells; direct output logic cells 114a and buried logic cells 114b. Direct output logic cells 114a are directly connected to I/O pins 124 via direct output lines 140. By "directly" it is meant that no product terms 128, LAB lines 116, local quadrant lines 118, global quadrant lines 120, and/or GV lines 122 are interposed between the output of a logic cell 114a and the I/O pin to which it is directly connected. Buried logic cells 114b can drive I/O pins 124 only through direct output logic cells 114a to which the outputs of buried logic cells 114b can be connected via output lines 144, local quadrant lines 118, LAB lines 116 and product terms 128.

Each direct output logic cell 114a includes two outputs buffered by two output buffers 141a and 142a. Output buffers 141a drive an output signal from an associated direct output logic cell 114a onto both an I/O pin 124, via output line 140, and a local quadrant line 118, via output line 144. In this way, a direct output logic cell 114a can either directly drive an I/O pin 124 or drive an input of either a direct output logic cell 114a or a buried logic cell 114b in the same quadrant 125 as the driving direct output logic cell 114a without having to place the output signal on a GV line 122 or pass the output signal through a GV multiplexer 154.

Buried logic cells 114b also include two outputs, which are buffered by output buffers 141b and 142b. Output buffers 141b drive an output signal from an associated buried logic cell 114b only onto a local quadrant line 118. In this way, a buried logic cell 114b can drive the input of either a direct output logic cell 114a or a buried logic cell 114b in the same quadrant as the driving buried logic cell 114b without having to place the output signal on a GV line or pass the signal through a GV multiplexer 154. Both output buffers 142a associated with direct output logic cells 114a, and output buffers 142b associated with buried I/O logic cells 114b, drive only onto GV lines 122. As discussed above, GV lines 122 are interconnected to global quadrant lines 120 which are in turn interconnected to LAB lines 116. Thus, output buffers 142a and 142b can drive inputs to either direct output logic cells 114a or buried logic cells 114b in any LAB 112 in any quadrant 125 of PLD 110.

Preferably, output buffers 142a and 142b are controlled by a programmable element. In the present embodiment, the programmable element is random access memory 143 to programmably control the output state of buffers 142a and 142b. Each quadrant of PLD 110 preferably also includes 100 I/O pins 124. In addition to I/O pins 124, each quadrant contains pins (not shown) to provide other signals to PLD 110 such as power, ground, clock, clear, and other control signals.

Each LAB also includes a clock select device 150. Clock select device 150 is controlled by global clock lines 152 and is interconnected to each logic cell 114a and 114b of each LAB 112 via lines 148. Clock select device 150 regulates components, such as the flip-flop, in the logic cells 114a, 114b.

Data signals can be input into PLD 110 in two ways. First, as shown in FIGS. 3 and 4, I/O pins 124 can drive tri-state input buffers 160. Preferably, input buffers 160 drive GV lines 122 to allow a signal input on I/O pins 124 connected to input buffers 160 to be input into any logic cell 114a, 114b in PLD 110. Preferably, input buffers 160 are controlled by a programmable RAM 161 to cause buffer 160 to block or pass an input signal from I/O pin 124. To drive the input of any logic cell 114a, 114b, an input signal which drives GV lines 122 from input buffers 160 must travel on a GV line 122 to feed a global quadrant line 120 through a GV multiplexer 154.

The second way in which an I/O signal can drive PLD 110 is to drive a multiplexer which drives a logic cell output buffer. As shown in FIG. 3, logic cell 114b can include a multiplexer 146 which drives output buffer 141b. Although FIG. 3 shows only a buried logic cell 114b including multiplexer 146 driving output buffer 141b, direct output logic cells 114a can also include a multiplexer 146 for driving an output buffer 141a. I/O pins 124 can feed input signals into multiplexer 146 and then into output buffer 141b. The signal can then be fed to a local quadrant line 118, and then to a logic cell 114a, 114b via a lab line 116. In this way, input signals can advantageously be fed from the output buffer 141a, 141b of a logic cell 114a, 114b into the inputs of logic cells 114a, 114b in the same quadrant as the output buffer 141a, 141b without having to travel along a GV 122 line or pass through a GV multiplexer 154.

As discussed above, PLD 110 is preferably laid out in four quadrants 125. Also, as noted above, output buffers 141b of buried logic cells 114b output signals only to local quadrant lines 118 of the quadrant in which the buried logic cell 114b is located. Additionally, the output buffers 141a of the direct output logic cells 114a in a given quadrant 125 are directly connected to the local quadrant lines 118 of the quadrant in which the direct output logic cells are located. The output buffers 141a of the direct output logic cells 114a in a given quadrant 125 are also connected to the I/O pins 124 which are associated with (that is, located along the two exterior edges 127a of) the quadrant 125. Thus, the I/O pins located along the exterior edges 127a of a quadrant 125 can be driven by output signals from logic cells located within that quadrant without having to transmit the output signals over a GV line 122 and through a GV multiplexer 154.

On the other hand, to drive an output signal from either a direct output logic cell 114a or buried logic cell 114b to an I/O pin 124 along an outer edge 127a of a quadrant 125 which does not contain the logic cell 114a or 114b requires placing the output signal on a GV line 122, via an output buffer 142a or 142b, and through a GV multiplexer 154. Such transmission of a signal over a GV line 122 and switching the signal through a GV multiplexer 154 can cause a delay in transmission time compared to a transmission from a logic cell 114a, 114b either directly to an I/O pin 124 or to another logic cell 114a, 114b through only local quadrant lines 118, LAB lines 116, and product terms 128.

An analogous situation exists with respect to input signals. I/O pins 124 which are directly connected to a multiplexer 146 of either a buried logic cell 114b or direct output logic cell 114a are all located along one of the two exterior edges 127a of the quadrant 125 in which the logic cell 114a, 114b is located. To take an input from one of these I/O pins 124 to a logic cell 114a, 114b in a quadrant with which the I/O pin 125 is not associated (that is, the pin is not located on an exterior edge 127a of the destination quadrant) requires transmitting the input signal through a GV line 122 and GV multiplexer 154. The signal can either be routed through an I/O pin 124 interconnected with GV lines 122 via input buffers 160, or through another logic cell 114a, 114b in the same quadrant as the driven logic cell and through an output buffer 142a or 142b onto a GV line 122. As with output signals, transmitting input signals via a GV line 122 and through a GV multiplexer 154 can cause a delay in transmission time not present when an input signal is not transmitted outside of a quadrant 125.

As discussed in the background section, if un-detected by a user, additional delay in either input or output signal transmission can adversely effect the operation of a circuit in which the PLD is used. However, PLD 110 is preferably laid out in quadrants 125, and, as noted above, the direct output logic cells 114a in a given quadrant 125 are always directly connected to the I/O pins 124 at the exterior edges 127a of that quadrant 125. Further, the I/O pins 124 at the exterior edges 127a of a given quadrant 125 will always drive into that quadrant 125. Thus, when programming and implementing PLD 110 in a circuit, a user can advantageously always be aware of the timing of an input or output signal to or from a given logic cell 114a, 114b depending upon the quadrant in which the logic cell 114a, 114b is located with relation to the I/O pin 124 being used. Specifically, a user can be sure that a signal either will or will not be transmitted over a GV line 122 and through a GV multiplexer 154.

Additionally, this will be the case regardless of the number of logic cells 114a, 114b carried by PLD 110. If more than 256 logic cells 114a and 114b are desired per quadrant 125, more logic cells 114a, 114b and more I/O pins 124 can be added to each quadrant of PLD 110 without having to route outputs of added logic cells 114a, 114b to I/O pins in other quadrants 125. Further, if more logic cells 114a, 114b are desired without having to incur the added expense of providing additional I/O pins 124, then it is only necessary to add buried logic cells 114b to the quadrants 125 of PLD 110 which already exist. There is no need to add additional zones of LABs 112. Therefore, no vertical migration needs to occur and no uncertainty arises regarding which I/O pins 124 are associated with which quadrants 125. The I/O pins 124 will always be associated with the quadrants which have the I/O pins 124 located on their respective exterior edges 127a.

This means that a user can be certain whether or not a given I/O pin-logic cell assignment will require a signal to be transmitted over a GV line 122 and through a GV multiplexer 154. If the I/O pin 124 is along the exterior edge 127a of the quadrant in which the assigned logic cell is located, no additional time needs to be taken into account because the input or output signal can be sent to or from the assigned logic cell without being transmitted over a GV line 122 or through a GV multiplexer 154. Thus, the same die can advantageously be used to fabricate PLDs having different numbers of logic cells and the same number of I/O pins without uncertainty arising regarding timing of output signals from the PLDs.

It will be understood that the foregoing is merely illustrative of the principles of this invention, and that various modifications can be made by those skilled in the art without departing from the scope and spirit of the invention.

What is claimed is:

1. A programmable logic device (PLD) comprising:
a plurality of zones on the PLD;
a plurality of logic cells distributed among the plurality of zones;
a plurality of I/O pins, each I/O pin permanently associated with one of the plurality of zones on the PLD; and
a plurality of interconnection lines for interconnecting the plurality of logic cells with the plurality of I/O pins such that the I/O pins permanently associated with a zone are directly connected to logic cells located in that zone.

2. The PLD of claim 1 wherein the PLD includes four quadrants.

3. The PLD of claim 2 wherein:
each quadrant of the PLD is substantially square and has two exterior edges and two interior edges; and
the portion of the I/O pins associated with each of the quadrants is located along the two exterior edges of the quadrant with which the portion of I/O pins is associated.

4. The PLD of claim 3 further including a plurality of logic array blocks (LABs) each including a portion of the plurality of logic cells and distributed among the four quadrants.

5. The PLD of claim 4 wherein each LAB includes the same number of logic cells.

6. The PLD of claim 5 wherein the PLD includes a plurality of direct output logic cells, and a plurality of buried logic cells, and wherein the plurality of direct output logic cells includes outputs which directly feed I/O pins and the plurality of buried logic cells includes outputs which feed only the plurality of interconnection lines.

7. The PLD of claim 6 wherein each quadrant includes:
LAB lines interconnecting the logic cells located in each LAB;
product terms interconnecting the logic cells with the LAB lines;
local quadrant lines interconnecting the outputs of the buried logic cells of a quadrant with the LAB lines of that quadrant; and
a plurality of programmable devices, one programmable device located at the interconnection of each LAB line with each product term.

8. The PLD of claim 7 wherein the PLD further includes a plurality of global transmission lines to allow a signal from one quadrant of the PLD to be transmitted to another quadrant of the PLD.

9. The PLD of claim 8 wherein:
each of the plurality of direct output logic cells includes a first output and a second output;
the first output is directly connected to one of the plurality of I/O pins; and
the second output is directly connected to one of the plurality of global transmission lines.

10. The PLD of claim 9 wherein:
at least one of the plurality of logic cells includes a multiplexer which includes at least a first input and a second input;
the first input of the multiplexer is fed by the first output of at least one of the plurality of logic cells; and
the second input of the multiplexer is directly fed by one of the plurality of I/O pins.

11. The PLD of claim 10 wherein at least one of the plurality of I/O pins is directly connected to at least one of the plurality of global transmission lines.

12. A method of fabricating a programmable logic (PLD) device having a plurality of logic cells, a plurality of I/O pins, and a plurality of interconnection lines, the method comprising the steps of:
dividing the PLD into four quadrants;
allocating the plurality of logic cells among each of the four quadrants;
permanently associating a portion of the plurality of I/O pins to each quadrant; and
directly connecting the portion of the plurality of I/O pins permanently associated with each quadrant to logic cells located in that quadrant.

13. The method of claim 12 wherein:
the step of dividing the PLD into four quadrants includes dividing the PLD into four substantially square quadrants with each quadrant including two exterior edges and two interior edges; and
the step of permanently associating a portion of the plurality of I/O pins to each quadrant includes locating each I/O pin which is permanently associated with a quadrant along an exterior edge of that quadrant.

14. The method of claim 13 including the step of:
forming a plurality of logic array blocks (LABs) from groups of the plurality of logic cells; and
allocating a portion of the plurality of LABs to each quadrant of the PLD.

15. A method of routing a signal in a programmable logic device (PLD) including the steps of:
dividing the PLD into a plurality of zones;
providing a plurality of I/O pins adjacent to each of the plurality of zones;
permanently associating a portion of the plurality of I/O pins to each zone;
allocating a plurality of logic array blocks (LABs) to each of the plurality of zones;
providing a plurality of local zone lines, each for providing communication between only the LABs within a given one of the plurality of zones; and
feeding a input signal through at least one of the plurality of I/O pins and onto at least one of the plurality of local zone lines to allow the input signal to be communicated to at least one of the LABs in the zone to which the one of the plurality of I/O pins is adjacent.

16. A method of routing a signal in a programmable logic device (PLD) including the steps of:
dividing the PLD into a plurality of quadrants;
providing a plurality of I/O pins adjacent to each of the plurality of quadrants;
permanently associating a portion of the plurality of I/O pins to each quadrant;
allocating a plurality of logic array blocks (LABs) to each of the plurality of quadrants;
providing a plurality of local quadrant lines each for providing communication between only the LABs within each one of the plurality of quadrants; and
feeding a input signal through at least one of the plurality of I/O pins and onto at least one of the plurality of local quadrant lines to allow the input signal to be communicated to at least one of the LABS in the quadrant to which the one of the plurality of I/O pins is adjacent.

* * * * *